United States Patent
Kulkarni et al.

(10) Patent No.: US 11,227,081 B2
(45) Date of Patent: Jan. 18, 2022

(54) CONFIGURATION BASED GENERATION OF RETRY COMPONENT FOR INTEGRATION ADAPTER

(71) Applicant: SAP SE, Walldorf (DE)

(72) Inventors: Gopalkrishna Kulkarni, Bangalore (IN); Bhupender Singh Rathee, Bangalore (IN)

(73) Assignee: SAP SE, Walldorf (DE)

( * ) Notice: Subject to any disclaimer, the term of this patent is extended or adjusted under 35 U.S.C. 154(b) by 77 days.

(21) Appl. No.: 15/930,952

(22) Filed: May 13, 2020

(65) Prior Publication Data

US 2021/0303752 A1  Sep. 30, 2021

(51) Int. Cl.
*G06F 30/20* (2020.01)
*G06F 9/54* (2006.01)
*G06F 9/48* (2006.01)
*G06F 3/0481* (2013.01)
*G06Q 10/06* (2012.01)
(Continued)

(52) U.S. Cl.
CPC ............ *G06F 30/20* (2020.01); *G06F 3/0486* (2013.01); *G06F 3/04817* (2013.01); *G06F 8/34* (2013.01); *G06F 9/4806* (2013.01); *G06F 9/546* (2013.01); *G06Q 10/067* (2013.01); *G06Q 10/0635* (2013.01)

(58) Field of Classification Search
CPC ........ G06F 8/34; G06F 30/20; G06F 3/04817; G06F 3/0486; G06F 9/4806; G06F 9/546; G06Q 10/0635; G06Q 10/067
USPC ......................................... 717/104, 105, 113
See application file for complete search history.

(56) References Cited

U.S. PATENT DOCUMENTS 7,463,263 B2 * 12/2008 Gilboa .................. G06T 11/206
                                              345/420
7,765,434 B2 *  7/2010 Cocker ............... G06F 11/3636
                                              714/45
(Continued)

OTHER PUBLICATIONS

MuseScore Handbook, Nov. 26, 2019, 246 pages, [retrieved on Sep. 6, 2021], Retrieved from the Internet: <URL:https://www.swahilimusicnotes.com/song/download/26063/pdf/Kow2QCrTQcM0On7RefU AzNqglX5M0TM68COdKakO.pdf>.*

(Continued)

*Primary Examiner* — Geoffrey R St Leger
(74) *Attorney, Agent, or Firm* — Buckley, Maschoff & Talwalkar LLC

(57) ABSTRACT

According to some embodiments, methods and systems may be associated with an integration computing environment for an enterprise. An integration modeling design platform may receive, from an integration developer via a modeling notation, an indication that a retry component should be associated with an integration task. The integration modeling design platform may then configure the retry component for the integration task in connection with at least one of an integration adapter and an integration component (e.g., a selection of a messaging component, a quality of service, a retry period, an exponential back off option, etc.). According to some embodiments, an integration generation framework, coupled to the integration modeling design platform, may automatically construct an appropriate runtime retry representation based on the configured retry component (e.g., by creating a domain-specific language software component).

18 Claims, 15 Drawing Sheets

(51) Int. Cl.
*G06F 3/0486* (2013.01)
*G06F 8/34* (2018.01)

(56) References Cited

U.S. PATENT DOCUMENTS

| | | | | |
|---|---|---|---|---|
| 7,774,780 | B2 * | 8/2010 | Chow | G06F 11/1479 |
| | | | | 718/101 |
| 8,051,406 | B2 * | 11/2011 | Knight | G06F 8/34 |
| | | | | 717/117 |
| 8,131,776 | B2 * | 3/2012 | Cicman | G06F 16/84 |
| | | | | 707/803 |
| 8,296,461 | B2 * | 10/2012 | Sirdevan | G06Q 10/06 |
| | | | | 709/246 |
| 2005/0246637 | A1 * | 11/2005 | Knight | G06N 5/025 |
| | | | | 715/700 |
| 2005/0273655 | A1 * | 12/2005 | Chow | G06F 11/1479 |
| | | | | 714/16 |
| 2007/0013697 | A1 * | 1/2007 | Gilboa | G06T 11/206 |
| | | | | 345/440 |
| 2008/0126873 | A1 * | 5/2008 | Cocker | G06F 11/3636 |
| | | | | 714/38.11 |
| 2009/0119416 | A1 * | 5/2009 | Sirdevan | H04L 69/08 |
| | | | | 709/246 |
| 2010/0281072 | A1 * | 11/2010 | Cicman | G06F 16/84 |
| | | | | 707/803 |
| 2010/0287553 | A1 * | 11/2010 | Schmidt | G06F 9/485 |
| | | | | 718/101 |
| 2011/0161920 | A1 * | 6/2011 | Alexander | G06F 11/0793 |
| | | | | 717/105 |

OTHER PUBLICATIONS

Nezhad, H. R., et al., Semi-Automated Adaptation of Service Interactions, Proceedings of the 16th international conference on World Wide Web, May 2007, pp. 993-1002, [retrieved on Oct. 20, 2021], Retrieved from the Internet: <URL:http://dl.acm.org/>.*

Basu, S., et al., Control Plane Integration for Cloud Services, Middleware Industrial Track '10: Proceedings of the 11th International Middleware Conference Industrial track, Nov. 2010, pp. 29-34, [retrieved on Oct. 20, 2021], Retrieved from the Internet: <URL: http://dl.acm.org/>.*

* cited by examiner

CONFIGURATION BASED GENERATION OF RETRY COMPONENT FOR INTEGRATION ADAPTER

BACKGROUND

An enterprise may utilize an integration domain to build enterprise-level data integration and data transformations solutions. An integration service designer may solve complex business problems by copying or downloading files, loading data warehouses, cleansing and mining data, managing Structured Query Language ("SQL") server objects and data, etc. As used herein, the phrase "integration service" may refer to any system that may extract and/or transform data from a wide variety of sources such as Extensible Markup Language ("XML") data files, flat files, relational data sources, etc. and then load data into one or more destinations. In some cases, a designer will want a component of an integration server to "retry" an operation. For example, if information is requested by a component but not received, the designer may want the component to retry another request for that information (e.g., after waiting five seconds). Manually coding such a retry operation, however, can be a time consuming and error-prone task for a designer—especially when there are a substantial number of components involved (e.g., a system might be associated with hundreds of adapters).

It would therefore be desirable to let integration developers implement and configure a retry component for integration adapters and/or components in an automatic and efficient manner.

SUMMARY

According to some embodiments, methods and systems may be associated with an integration computing environment for an enterprise. An integration modeling design platform may receive, from an integration developer via a modeling notation, an indication that a retry component should be associated with an integration task. The integration modeling design platform may then configure the retry component for the integration task in connection with at least one of an integration adapter and an integration component (e.g., a selection of a messaging component, a quality of service, a retry period, an exponential back off option, etc.). According to some embodiments, an integration generation framework, coupled to the integration modeling design platform, may automatically construct an appropriate runtime retry representation based on the configured retry component (e.g., by creating a domain-specific language software component).

Some embodiments comprise: means for means for receiving, at an integration modeling design platform from an integration developer via a modeling notation, an indication that a retry component should be associated with an integration task; means for configuring, by the integration modeling design platform, the retry component for the integration task in connection with at least one of an integration adapter and an integration component; and means for automatically constructing, by an integration generation framework, an appropriate runtime retry representation based on the configured retry component.

Some technical advantages of some embodiments disclosed herein are improved systems and methods to let integration developers implement and configure a retry component for integration adapters and/or components in an automatic and efficient manner.

DETAILED DESCRIPTION

In the following detailed description, numerous specific details are set forth in order to provide a thorough understanding of embodiments. However, it will be understood by those of ordinary skill in the art that the embodiments may be practiced without these specific details. In other instances, well-known methods, procedures, components and circuits have not been described in detail so as not to obscure the embodiments.

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1A:
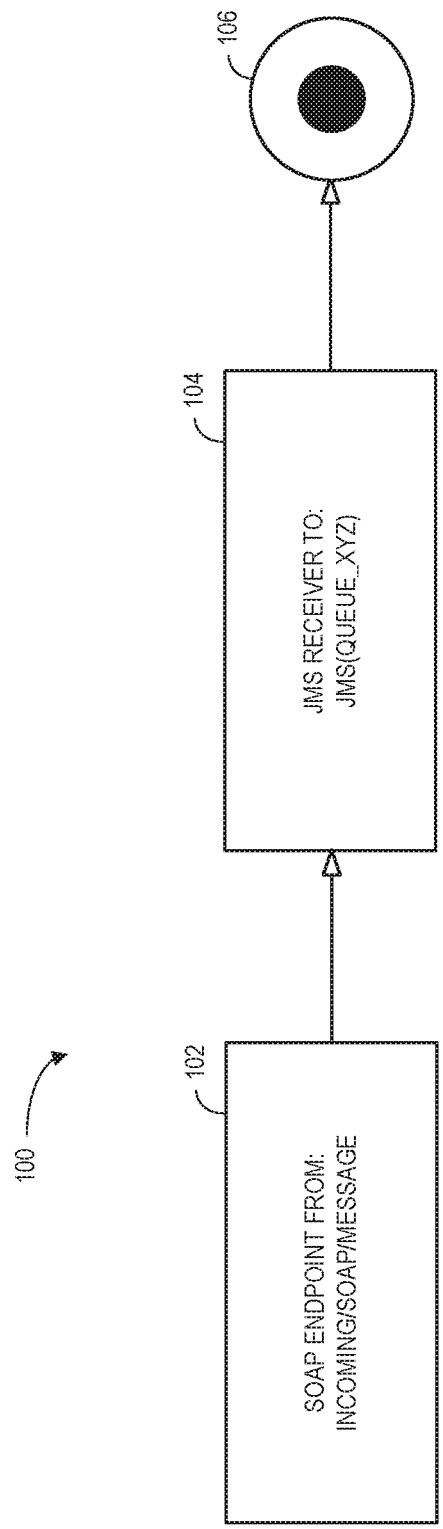
FIGS. 1A and 1B illustrate scenarios associated with a retry mechanism in an integration service.
Figure 1B:
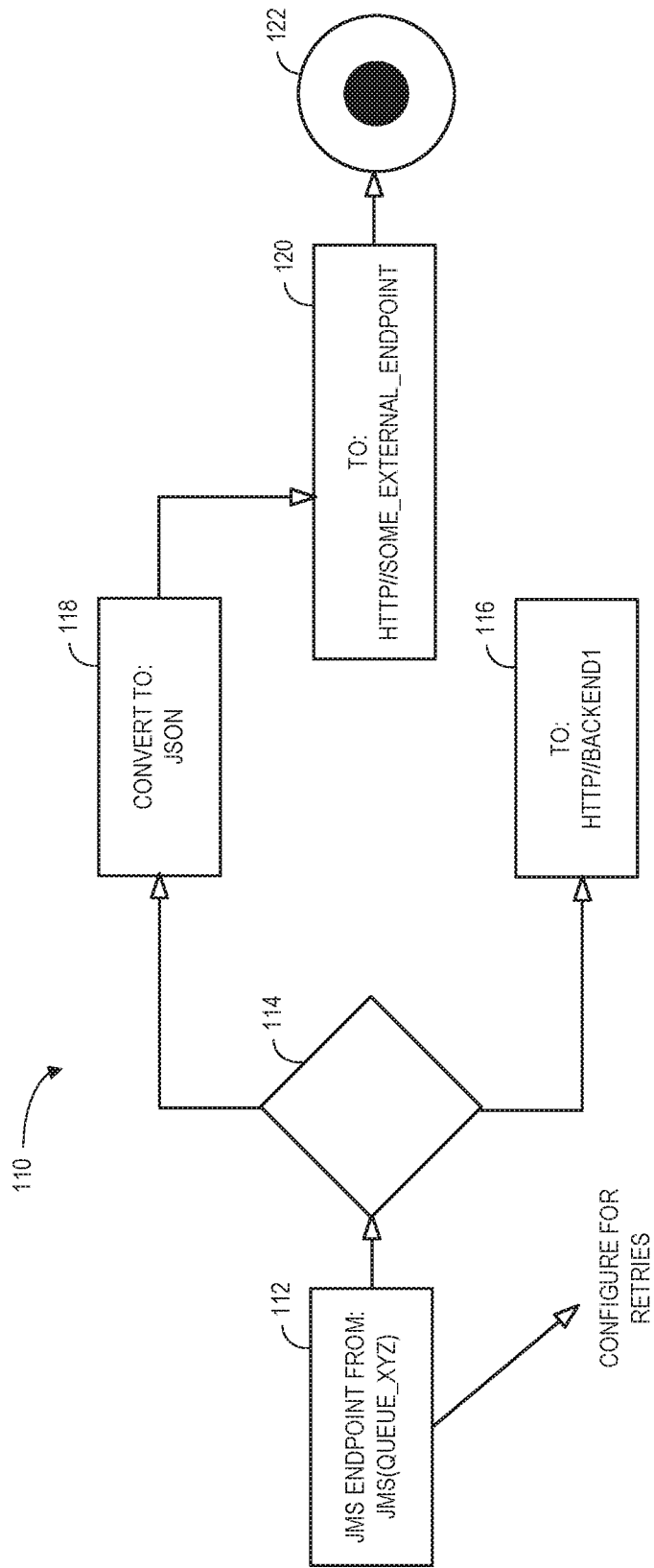

Note that it is not very common to offer a retry mechanism per adapter in an integration service. Usually, there is a messaging adapter (e.g., a Java Messaging Service ("JMS")) which can be used to persist messages and offer retries based on an error in an integration scenario. For example, FIGS. 1A and 1B illustrate scenarios 110, 120 associated with a retry mechanism in an integration service. In the first modeled scenario 110, an incoming Simple Object Access Protocol ("SOAP") message is first stored in a JMS messaging system. In particular, a SOAP endpoint is received 102 and provided to a JMS "queue_xyz" 104 before continuing 106. In the second scenario 120, information is retrieved for the actual processing. In particular, a JMS endpoint is received from "queue_xyz" 112 (which is configured for retries).

Based on a condition 114, information may be provided to a "backend1" 116 or converted to JavaScript Object Notation ("JSON") 118 before being provided to "some_external_endpoint" 120 and continuing 122. Note that the integration scenario can become complicated for this type of disconnected handling of retries. It may also be difficult to track failures and exactly point out which component has failed. If an adapter needs to use a re-try mechanism, it will be usually an implementation effort for the owner (or team) of the integration adapter. Also, creating such a feature can take quite a lot of time (resulting in customer dissatisfaction and potential loss of business revenue).

Figure 2:
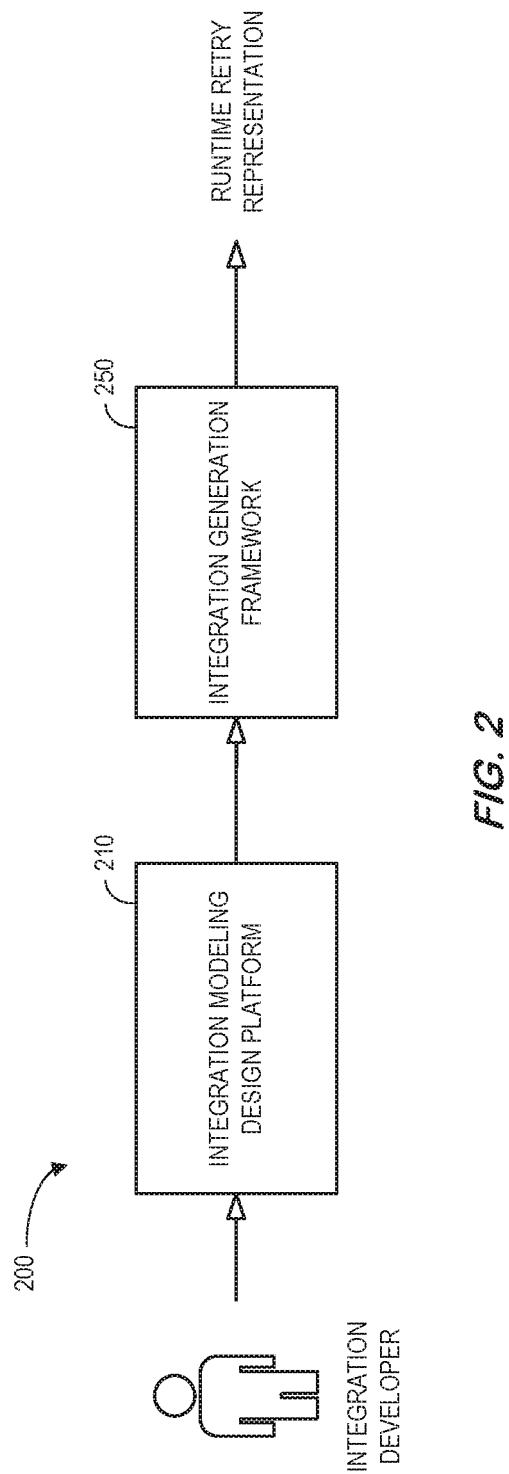
FIG. 2 is a high-level block diagram of a system in accordance with some embodiments.

To avoid this, FIG. 2 is a high-level block diagram of a system 200 in accordance with some embodiments. The system 200 includes an integration modeling design platform 210 that may be utilized by an integration developer. Moreover, an integration generation framework 250 may output a runtime retry representation. Portions of the system might operate automatically or be initiated via a command from a remote operator interface device. As used herein, the term "automatically" may refer to, for example, actions that can be performed with little or no human intervention.

As used herein, devices, including those associated with the system 200 and any other device described herein, may exchange information via any communication network which may be one or more of a Local Area Network ("LAN"), a Metropolitan Area Network ("MAN"), a Wide Area Network ("WAN"), a proprietary network, a Public Switched Telephone Network ("PSTN"), a Wireless Application Protocol ("WAP") network, a Bluetooth network, a wireless LAN network, and/or an Internet Protocol ("IP") network such as the Internet, an intranet, or an extranet. Note that any devices described herein may communicate via one or more such communication networks.

The integration modeling design platform 210 and/or the integration generation framework 250 may store information into and/or retrieve information from various data stores (e.g., data storage devices), which may be locally stored or reside remote from the integration modeling design platform 210 and/or the integration generation framework 250. Although a single integration modeling design platform 210 and integration generation framework 250 are shown in FIG. 2, any number of such devices may be included. Moreover, various devices described herein might be combined according to embodiments of the present invention. For example, in some embodiments, the integration modeling design platform 210 and the integration generation framework 250 might comprise a single apparatus. The system 200 functions may be performed by a constellation of networked apparatuses, such as in a distributed processing or cloud-based architecture.

A user or administrator may access the system 200 via a remote device (e.g., a Personal Computer ("PC"), tablet, or smartphone) to view information about and/or manage operational information in accordance with any of the embodiments described herein. In some cases, an interactive graphical user interface display may let an operator or administrator define and/or adjust certain parameters (e.g., to configure a retry mechanism) and/or provide or receive automatically generated recommendations or results from the system 200.

Figure 3:
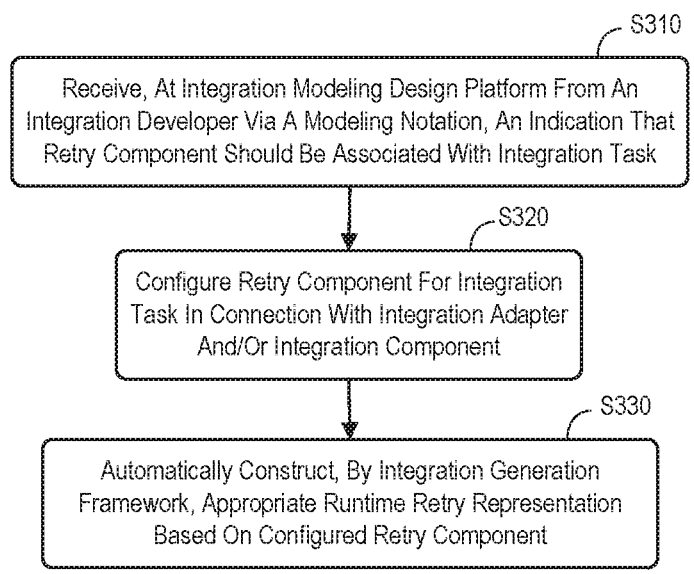
FIG. 3 is a method according to some embodiments.

FIG. 3 is a method that might performed by some or all of the elements of the system 200 described with respect to FIG. 2. The flow charts described herein do not imply a fixed order to the steps, and embodiments of the present invention may be practiced in any order that is practicable. Note that any of the methods described herein may be performed by hardware, software, or any combination of these approaches. For example, a computer-readable storage medium may store thereon instructions that when executed by a machine result in performance according to any of the embodiments described herein. The method might be associated with an integration computing environment, such as an integration service or enterprise integration.

At S310, an integration modeling design platform may receive, from an integration developer via a modeling notation, an indication that a retry component should be associated with an integration task (e.g., a send task, a receive task, etc.). According to some embodiments, the modeling notation is associated with a Business Process Model and Notation ("BPMN") system or similar graphical representation to specify business processes in a business process model.

The received indication might include a selection of a messaging component, such as JMS, active MQ, a custom implementation, etc. Moreover, the received indication might include a Quality Of Service ("QOS"), a retry period, an exponential back off option, etc. In some embodiments, the received indication is associated with a retry icon placed on a task icon via a drag-and-drop operation (e.g., as described in connection with FIGS. 4A, 4B, and 4C). Moreover, the integration modeling design platform might verify that the drag-and-drop operation is valid for the integration adapter or integration component associated with the task icon (e.g., as described in connection with FIG. 4D). In other embodiments, the received indication is associated with selection of a retry checkbox selection (e.g., as described in connection with FIG. 4E).

At S320, the integration modeling design platform may configure the retry component for the integration task in connection with at least one of an integration adapter and an integration component. According to some embodiments, at least one of the integration adapter and the integration component is associated with a custom element that may be added by a developer external to the enterprise. At S330, an integration generation framework may automatically construct an appropriate runtime retry representation based on the configured retry component. In this way, the method may provide for a configuration based generation of a retry component (e.g., for an integration adapter).

Note that an integration service or enterprise integration may be associated with a software component that allows an enterprise to connect different data points, Application Programming Interfaces ("APIs"), applications, and devices in an interoperable manner. There are various types of software available that offer enterprise integration. In an integration service, an "adapter" may be considered a "first class" citizen (i.e., an integration developer uses different adapters to connect different data points). Typically, an integration service consists of a Graphical User Interface ("GUI") to model an integration scenario (which may mainly consist of adapters). This GUI representation of the model is then converted to a compatible runtime representation, for example, a Java jar artifact. This conversion may be referred to as a "generation" component.

Some embodiments described herein provide a retry component that can be configured for any integration adapters and/or component. Moreover, an integration developer may be offered an integration modeling notation for retry. This notation might simply be dragged onto any adapter component, and that component will be offering message retires with, possibly, a QOS level. Some embodiments may also provide a method of offering different retry components as a design choice and/or provide a solution for a runtime implementation of such a feature.

According to some embodiments, a framework may be broken into three stages:

offering a modeling construct using BPMN notation,
offering a choice of different messaging components for the retries (e.g., JMS, ActiveMQ, or a custom implementation, and
using an integration's generation framework to construct appropriate runtime representation.

Figure 4A:
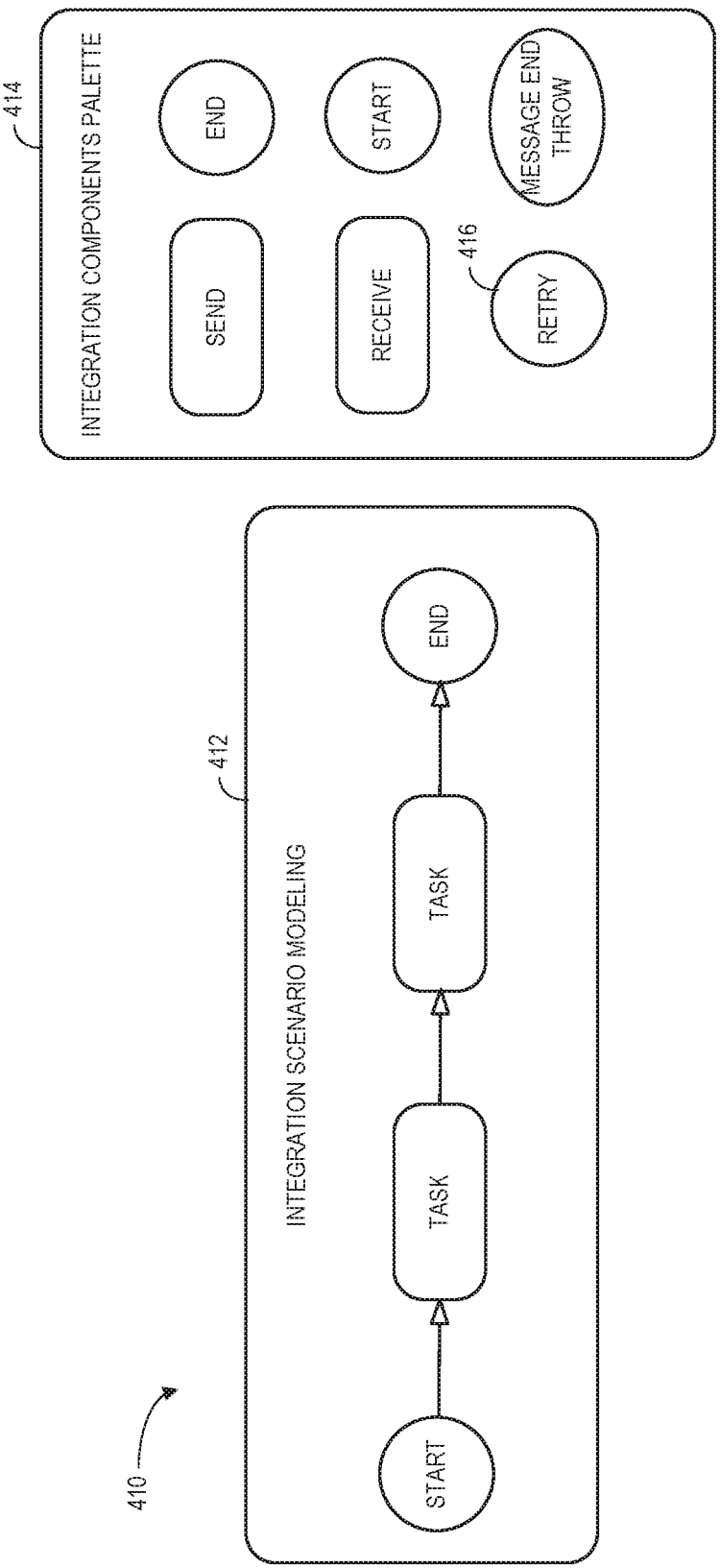
FIGS. 4A through 4E illustrate a BPMN like notation based retry component addition to an existing integration component in accordance with some embodiments.
Figure 4B:
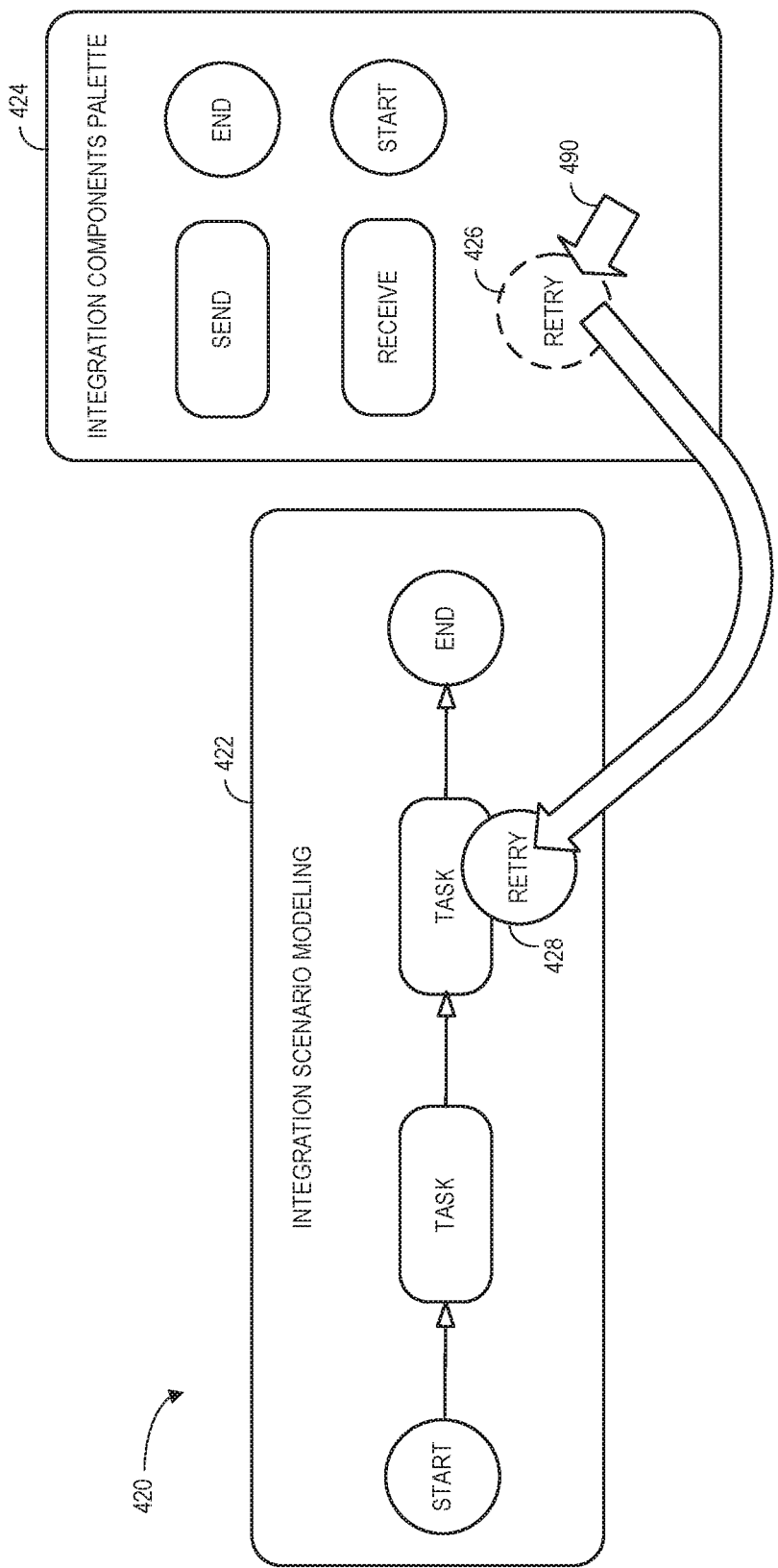
Figure 4C:
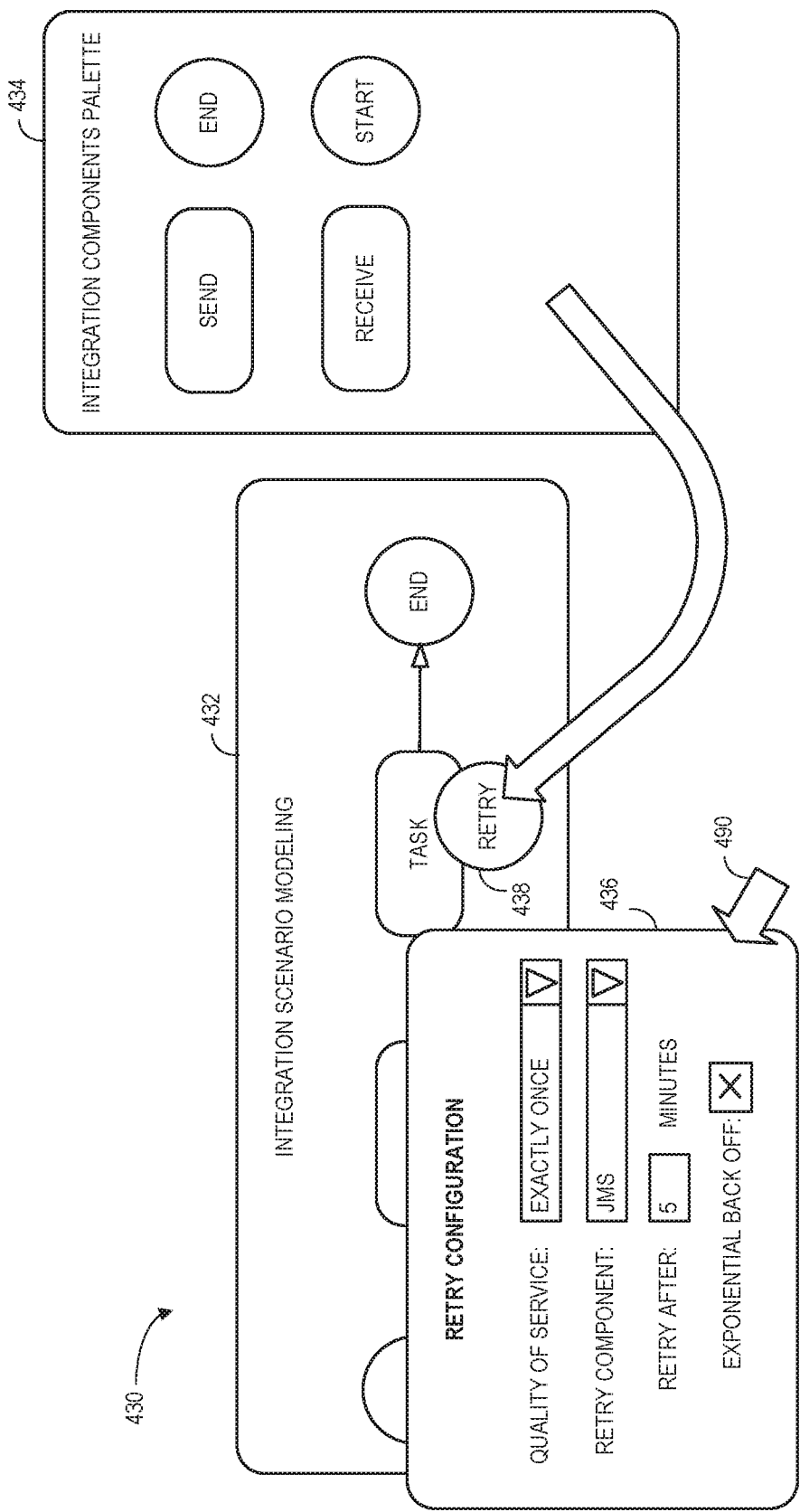
Figure 4D:
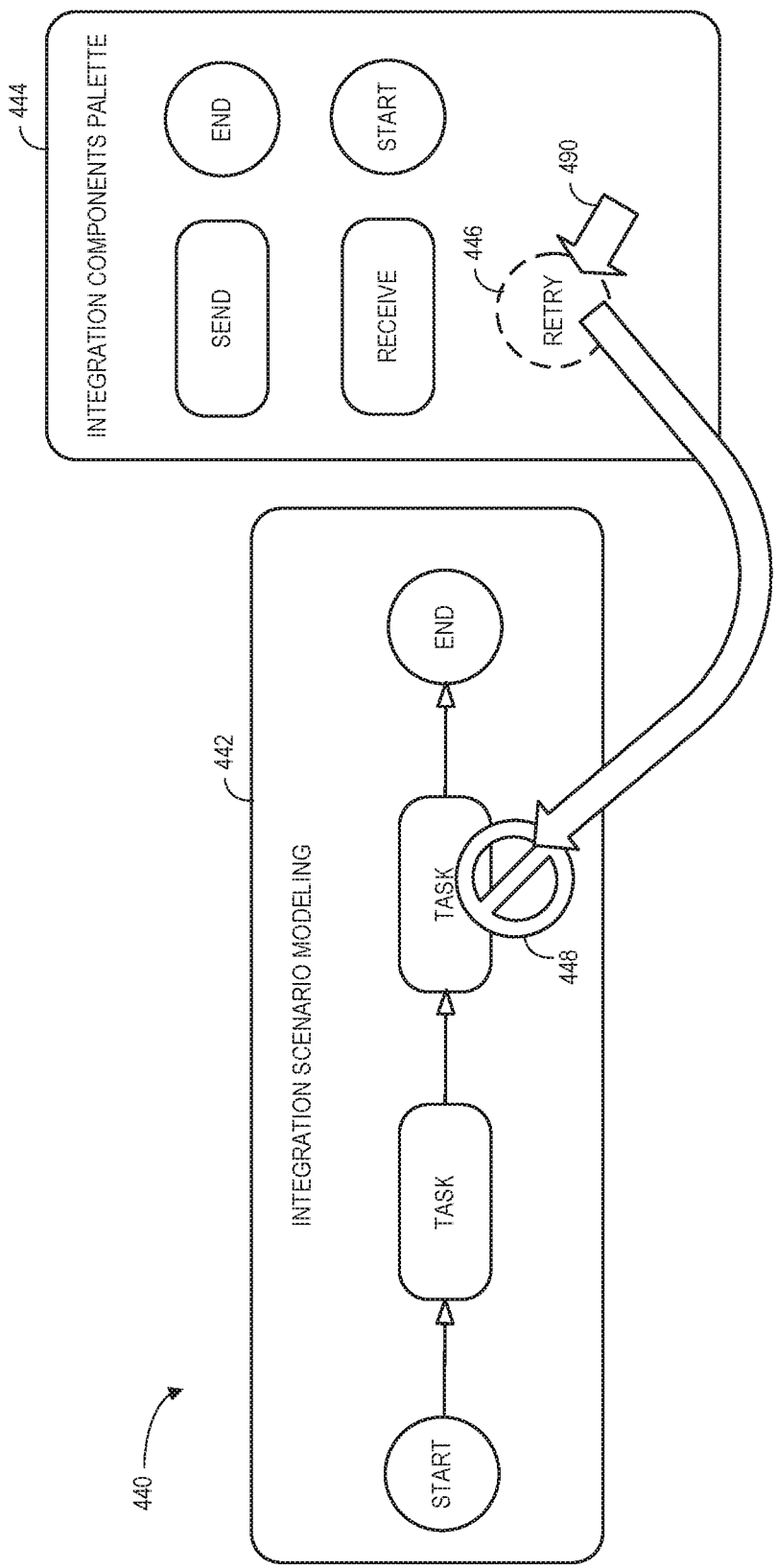
Figure 4E:
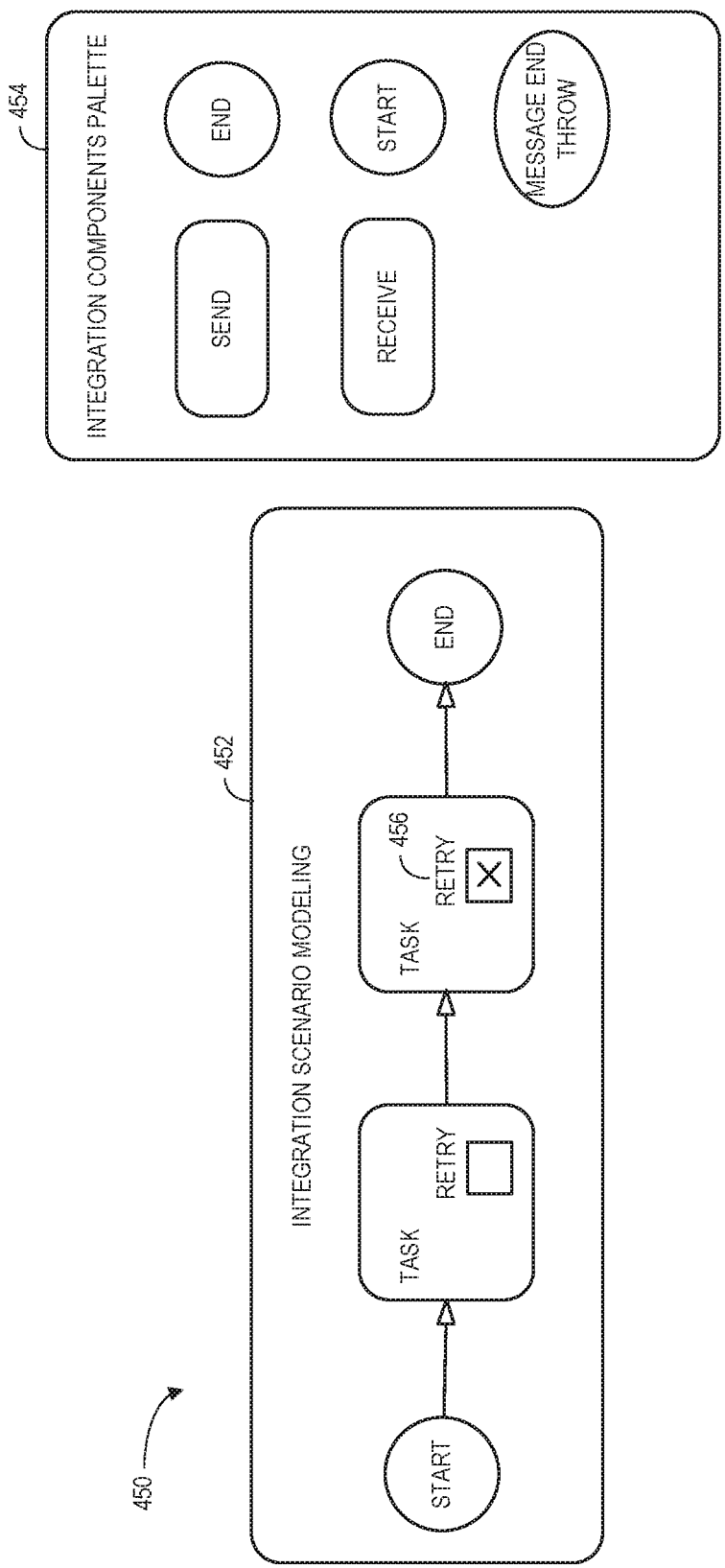

FIGS. 4A through 4E illustrate a BPMN like notation based retry that can be added to an existing integration component in accordance with some embodiments. As part of the overall integration developer experience, an integration developer may see a retry notation or icon in a component palette. For example, FIG. 4A illustrates a system 410 including an integration scenario modeling portion 412 (e.g., where a designer can graphically create a business model by attaching various tasks) and an integration components palette 414 where tasks (e.g., send or receive) and other model elements can be selected by a designer. In this embodiment, a BPMN like notation based retry component (a retry icon 416) is provided in addition to other existing integration components in the palette 414. As illustrated by the system 420 of FIG. 4B, a designer can select a retry icon 426 (e.g., via a computer mouse pointer 490) in an integration components palette 424 and move it to a component (e.g., a task) in an integration scenario modeling portion 422 via a drag-and-drop operation. The newly positioned icon 428 indicates that the component will utilize a retry mechanism.

As illustrated by the system 430 of FIG. 4C, after a designer moves the retry icon 438 from an integration components palette 434 to a component (e.g., a task) in the integration scenario modeling portion 432, a retry configuration window 436 may be used to configure retry parameters for that task. For example, the designer might select an appropriate QOS (e.g., from a dropdown menu of options using a computer mouse pointer 490), retry component, retry time period, an exponential back off option, etc.

Note that it is possible that some adapters will not support a retry mechanism. For example, as illustrated by the system 440 of FIG. 4D, a designer can select a retry icon 446 (e.g., via a computer mouse pointer 490) in an integration components palette 444 and try to move it to a component (e.g., a task) in an integration scenario modeling portion 442 via a drag-and-drop operation. According to this embodiment, a "prohibited" icon 428 indicates that the component cannot utilize a retry mechanism. Note that a retry component framework may establish a contract at User Interface ("UI") modeling, generation level. Only those components that adhere to the contract (interface) are allowed to model with retry. For example, a developer may try to drag-and-drop a retry component 446 onto an adapter, but the operation may not have any effect on non-agreed components. On valid components, the BPMN notation appears on the adapter.

Note that a drag-and-drop implementation is not the only way that embodiments might be implements. For example, as illustrated by the system 450 of FIG. 4E, a designer can select a retry checkbox 456 (e.g., via a computer mouse pointer) in a task shown within an integration scenario modeling portion 452 without using an integration components palette 454. That is, embodiments do not need to be implemented with a GUI drag-and-drop option from the palette 454 but can also be handled by an attribute of the integration adapter. For example, an integration adapter can have a dedicated attribute to show compatibility with a retry component using the checkbox 456. If this checkbox 456 is selected, and retry values are populated in an adapter configuration, the appropriate retry generation may continue to work.

In addition to a retry mechanism, in some embodiments an integration modeling design platform may further support other mechanisms, such as a log step component, an intercept step component, etc. That is, similar functionality can be offered for these other components (like adding a log step or an intercept step) using this approach in addition to, or instead of, a retry mechanism (that is, embodiments are not limited to retry components).

Figure 5:
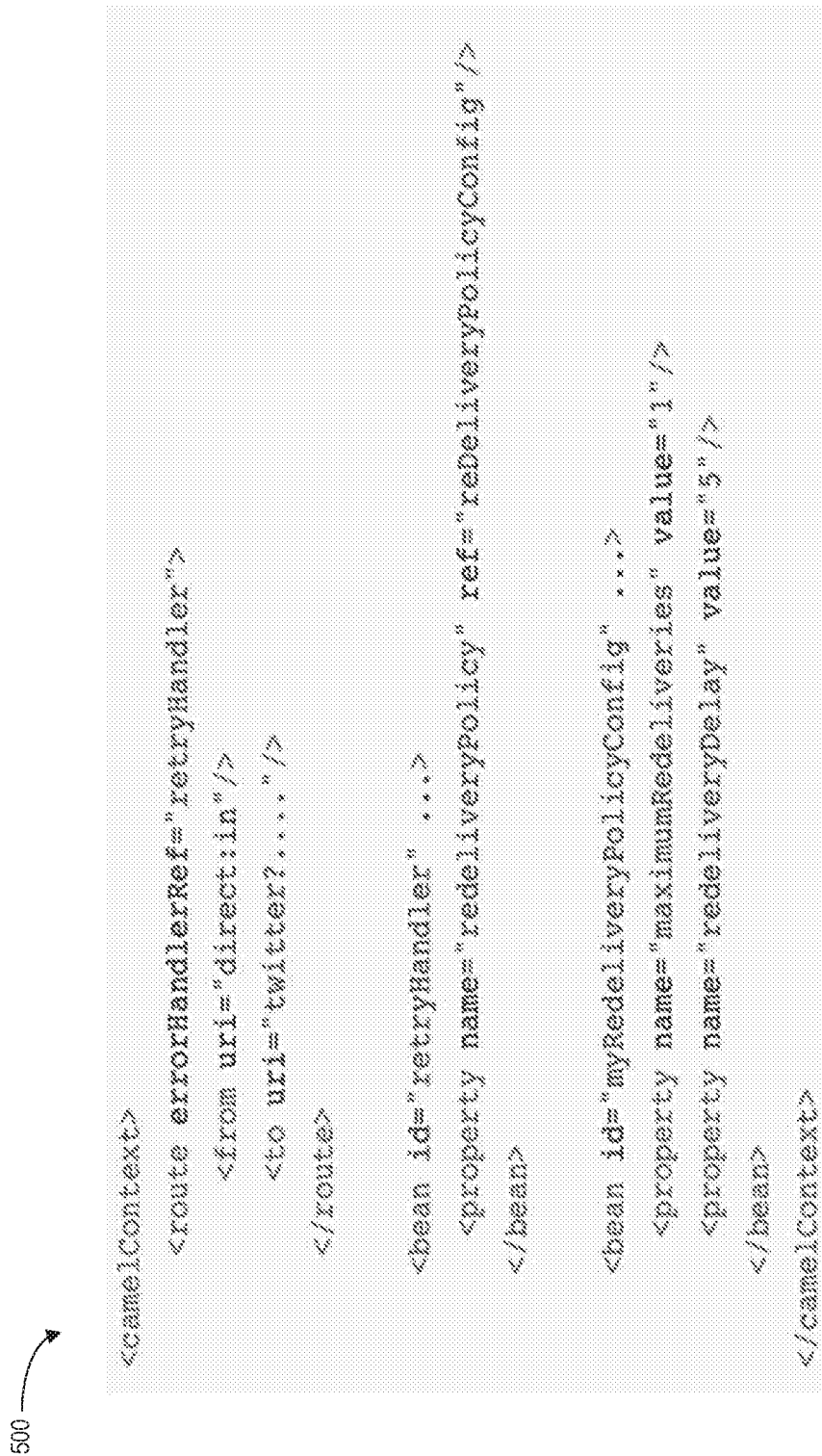
FIG. 5 is a domain-specific language runtime software component that might be added to an existing generation framework according to some embodiments.

In some embodiments, an integration generation framework automatically creates a Domain-Specific Language ("DSL") software component based on a configured retry component. For example, FIG. 5 is a DSL runtime software component 500 that might be added to an existing generation framework according to some embodiments. This component 500 may contain, for example, a list of a re-usable component's generation syntax such as JMS. Any number of retry generation syntax might be added to this component 500. Based on the UI selections, an appropriate generation of the component 500 will occur. For example, an APACHE CAMEL™ based runtime DSL might be generated as illustrated in FIG. 5 (note that the component 500 illustrated in FIG. 5 is not complete and is just provided for reference) after a user has selected a retry component for an existing adapter named "twitter." Note that the generation of the component 500 can be extended for re-usable components such as JMS, active MQ, etc. In these cases, a retry may be attempted from a queue with longer persistence.

Some embodiments may be associated with method to add a retry component generation to an existing custom adapter development framework. For example, an enterprise may support frameworks where external developers can add custom adapters. Embodiments may implement a similar method of offering a retry capability to these custom adapters.

Figure 6:
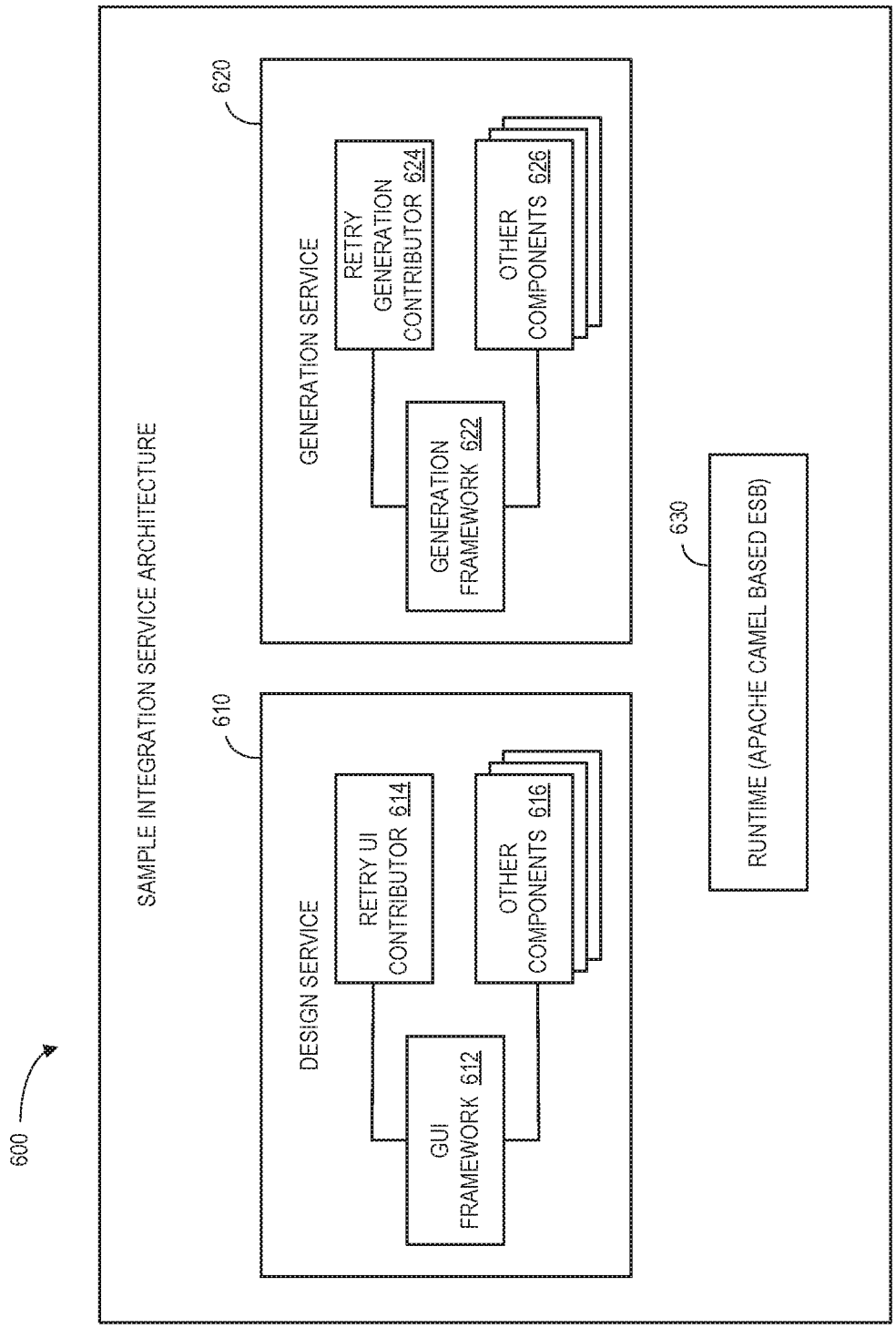
FIG. 6 is a software implementation approach for a SOA architecture based integration service in accordance with some embodiments.

FIG. 6 is a software implementation approach 600 for a Service Oriented Architecture ("SOA") based integration service in accordance with some embodiments. Although FIG. 6 is based on a SOA architecture, note that embodiments may instead be based on a microservice architecture or similar approach. The sample integration service architecture 600 includes a design service 610, a generation service 620, and a runtime 630 (e.g., an APACHE CAMEL™ based Enterprise Service Bus ("ESB")). The design service 610 may include a GUI framework 612, a retry UI contributor 614, and other components 616. The generation service 620 may include a generation framework 622, a retry generation contributor 624, and other components 626. According to some embodiments, the retry component based UI and generation components may be added to an existing architecture such that it gets the user configuration and adds an appropriate generation.

Figure 7:
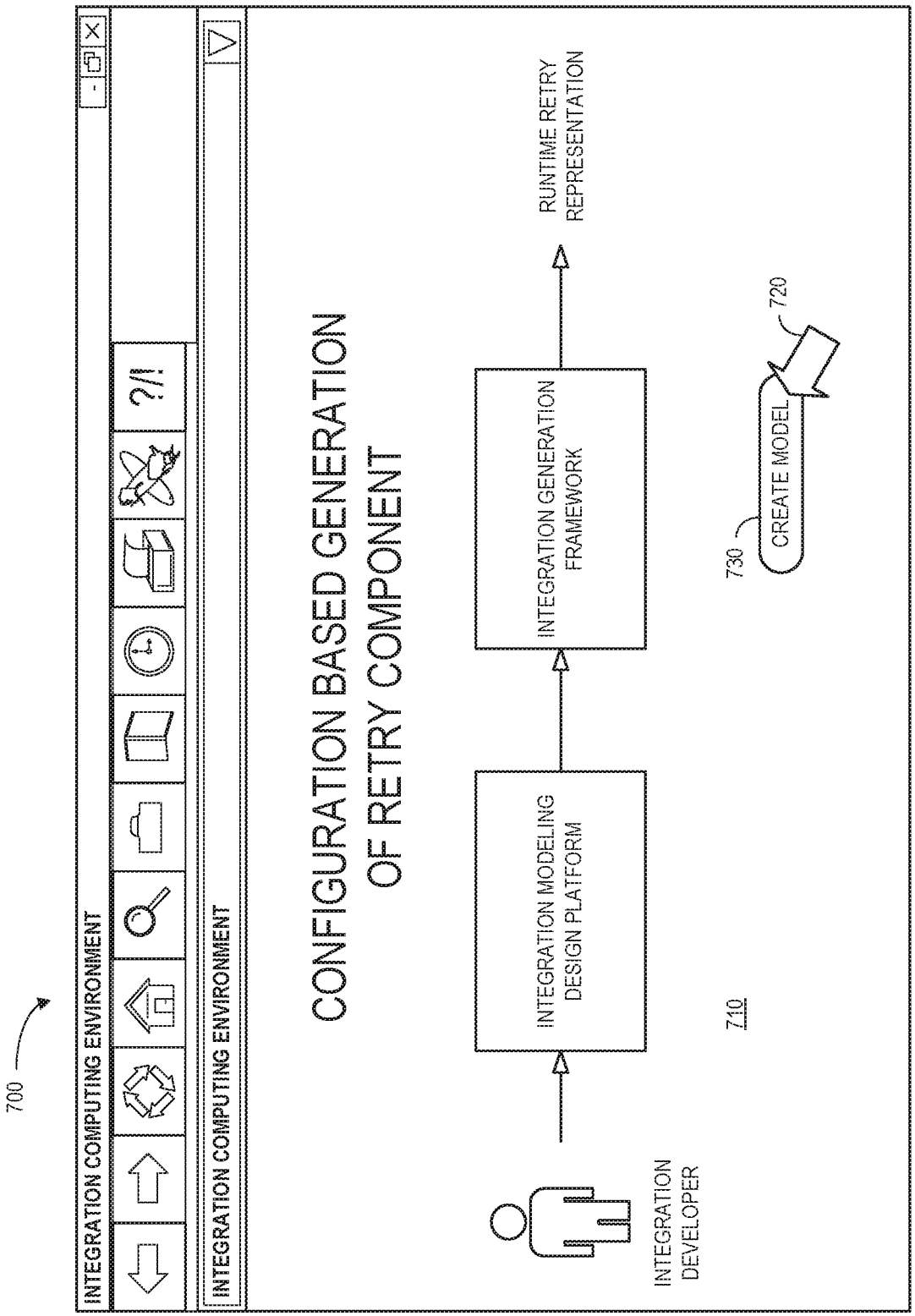
FIG. 7 is a human machine interface display according to some embodiments.

FIG. 7 is a human machine interface display 700 in accordance with some embodiments. The display 700 includes a graphical representation 710 of an integration system in accordance with any of the embodiments described herein. Selection of an element on the display 700 (e.g., via a touchscreen or a computer mouse pointer 720) may result in display of a pop-up window containing more detailed information about that element and/or various options (e.g., to add retry configuration options, validity rules, etc.). Selection of a "Create Model" icon 730 may also let an operator or administrator adjust the operation of the integration system.

Figure 8:
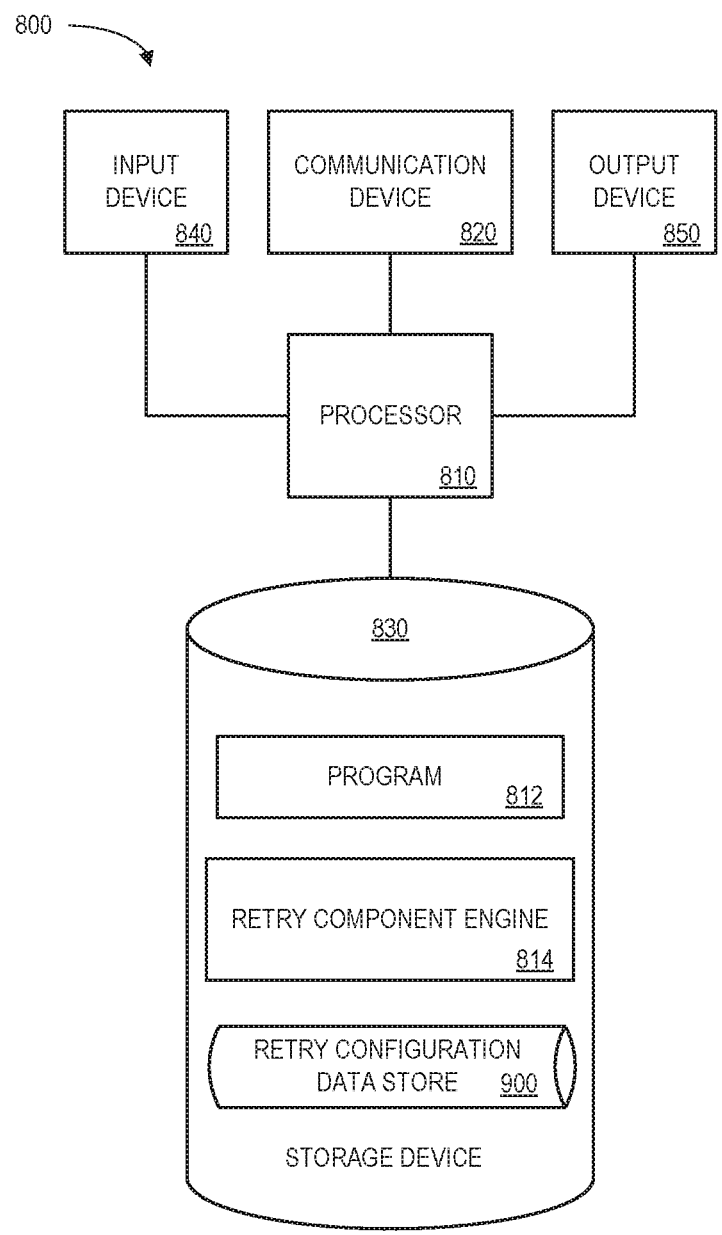
FIG. 8 is an apparatus or platform according to some embodiments.

Note that the embodiments described herein may also be implemented using any number of different hardware configurations. For example, FIG. 8 is a block diagram of an apparatus or platform 800 that may be, for example, associated with the systems 100, 400 of FIGS. 1 and 4, respectively (and/or any other system described herein). The platform 800 comprises a processor 810, such as one or more commercially available Central Processing Units ("CPUs") in the form of one-chip microprocessors, coupled to a communication device 860 configured to communicate via a communication network (not shown in FIG. 8). The communication device 860 may be used to communicate, for example, with one or more remote user platforms, administrator platforms, etc. The platform 800 further includes an input device 840 (e.g., a computer mouse and/or keyboard to input retry and integration service information) and/an output device 850 (e.g., a computer monitor to render a display, transmit recommendations, and/or create reports about integration services, models, etc.). According to some embodiments, a mobile device, monitoring physical system, and/or PC may be used to exchange information with the platform 800.

The processor 810 also communicates with a storage device 830. The storage device 830 may comprise any appropriate information storage device, including combinations of magnetic storage devices (e.g., a hard disk drive), optical storage devices, mobile telephones, and/or semiconductor memory devices. The storage device 830 stores a program 812 and/or a service creation platform engine 814 for controlling the processor 810. The processor 810 performs instructions of the programs 812, 814, and thereby operates in accordance with any of the embodiments described herein. For example, the processor 810 may receive, from an integration developer via a modeling notation, an indication that a retry component should be associated with an integration task. The processor 810 may then configure the retry component for the integration task in connection with at least one of an integration adapter and an integration component (e.g., a selection of a messaging component, a quality of service, a retry period, an exponential back off option, etc.). According to some embodiments, the processor 810 may automatically construct an appropriate runtime retry representation based on the configured retry component (e.g., by creating a domain-specific language software component).

The programs 812, 814 may be stored in a compressed, uncompiled and/or encrypted format. The programs 812, 814 may furthermore include other program elements, such as an operating system, clipboard application, a database management system, and/or device drivers used by the processor 810 to interface with peripheral devices.

As used herein, information may be "received" by or "transmitted" to, for example: (i) the platform 800 from another device; or (ii) a software application or module within the platform 800 from another software application, module, or any other source.

In some embodiments (such as the one shown in FIG. 8), the storage device 830 further stores an retry configuration data store 900. An example of a database that may be used in connection with the platform 800 will now be described in detail with respect to FIG. 9. Note that the database described herein is only one example, and additional and/or different information may be stored therein. Moreover, various databases might be split or combined in accordance with any of the embodiments described herein.

Figure 9:
FIG. 9 is portion of an integration service data store in accordance with some embodiments.

Referring to FIG. 9, a table is shown that represents the retry configuration data store 900 that may be stored at the platform 800 according to some embodiments. The table may include, for example, entries associated with users in a cloud computing environment. The table may also define fields 902, 904, 906, 908, 910 for each of the entries. The fields 902, 904, 906, 908, 910 may, according to some embodiments, specify: an integration designer identifier 902, a retry component identifier 904, an integration task identifier 906, a quality of service 908, and a retry component 910. The retry configuration data store 900 may be created and updated, for example, when a designer configures retry parameters via a model notation interface, etc.

The integration designer identifier 902 might be a unique alphanumeric label that is associated with an integration designer or developer who is configuring retry parameters. The integration task identifier 906 indicates a task (e.g., send or receive) that will implement a retry mechanism identified by the retry component identifier 904. The quality of service 908 and retry component 910 indicate the configuration values that were input by the designer.

Thus, embodiments may offer a retry mechanism in multiple ways:
an integration scenario level retry, and
a specific adapter level retry.

Embodiments may help avoid integration scenarios in which complex modeling results in a loss of productivity of an integration developer (e.g., adapter level specific handling might not cover all of the adapters which may delay implementation). Instead, embodiments may provide for the easy consumption of the integration scenario. Moreover, the integration developer may understand the retry constructs easily because it is offered as a re-usable component. An integration developer does not need to understand the specific implementation of each adapter (which can vary). Also, from the software developer point of view, adding the retry feature to an existing adapter may be faster as compared to implementing a retry from scratch (the adapter may just extend its contract and be available as a retry-able adapter).

Figure 10:
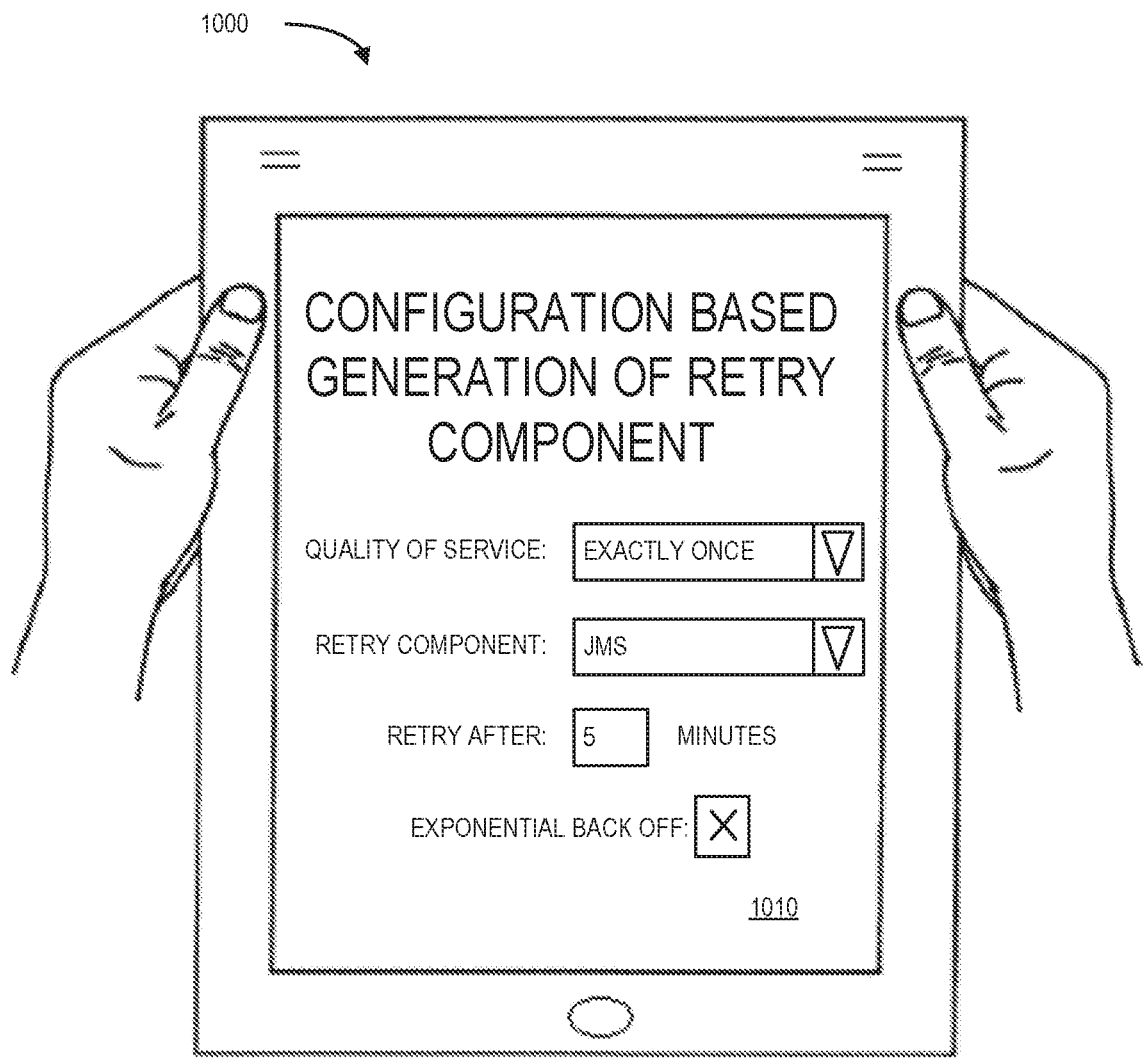
FIG. 10 is a tablet computer according to some embodiments.

Although specific hardware and data configurations have been described herein, note that any number of other configurations may be provided in accordance with some embodiments of the present invention (e.g., some of the information associated with the databases described herein may be combined or stored in external systems). Moreover, although some embodiments are focused on particular types of integration services and microservices, any of the embodiments described herein could be applied to other types of applications. Moreover, the displays shown herein are provided only as examples, and any other type of user interface could be implemented. For example, FIG. 10 illustrates a tablet computer 1000 with a configuration based generation of retry component display 1010. The display 1010 might be used, for example, by an integration designer to configure retry parameters (e.g., a QOS, retry component, a retry period, an exponential back off option, etc.).

The present invention has been described in terms of several embodiments solely for the purpose of illustration. Persons skilled in the art will recognize from this description that the invention is not limited to the embodiments described, but may be practiced with modifications and alterations limited only by the spirit and scope of the appended claims.

The invention claimed is:
1. A system associated with an integration computing environment for an enterprise, comprising:
an integration modeling design platform, including:
a computer processor, and computer memory, coupled to the computer processor, storing instructions that, when executed by the computer processor cause the processor to:
receive, from an integration developer via a modeling notation, an indication, associated with a retry icon placed on a task icon via a drag-and-drop operation, that a retry component should be associated with an integration task,
verify that the drag-and-drop operation is valid for an integration adapter or an integration component associated with the task icon, and
configure the retry component for the integration task in connection with the integration adapter or the integration component; and
an integration generation framework, coupled to the integration modeling design platform, to automatically construct an appropriate runtime retry representation based on the configured retry component.

2. The system of claim 1, wherein the integration computing environment is associated with at least one of: (i) an integration service, and (ii) enterprise integration.

3. The system of claim 1, wherein the modeling notation is associated with a business process model and notation system.

4. The system of claim 1, wherein the received indication includes a selection of a messaging component associated with at least one of: (i) Java message service, (ii) active MQ, and (iii) a custom implementation.

5. The system of claim 4, wherein the received indication includes a selection of at least one of: (i) a quality of service, (ii) a retry period, and (iii) an exponential back off option.

6. The system of claim 1, wherein the integration task is associated with at least one of: (i) a send task, and (ii) a receive task.

7. The system of claim 1, wherein the received indication is associated with selection of a retry checkbox selection.

8. The system of claim 1, wherein the integration modeling design platform further supports at least one of: (i) a log step component, and (ii) an intercept step component.

9. The system of claim 1, wherein the integration generation framework automatically creates a domain-specific language software component based on the configured retry component.

10. The system of claim 1, wherein at least one of the integration adapter and the integration component is associated with a custom element that may be added by a developer external to the enterprise.

11. A computer-implemented method associated with an integration computing environment for an enterprise, comprising:
receiving, at an integration modeling design platform from an integration developer via a modeling notation, an indication, associated with a retry icon placed on a task icon via a drag-and-drop operation, that a retry component should be associated with an integration task;
verifying that the drag-and-drop operation is valid for an integration adapter or an integration component associated with the task icon;
configuring, by the integration modeling design platform, the retry component for the integration task in connection with the integration adapter or the integration component; and
automatically constructing, by an integration generation framework, an appropriate runtime retry representation based on the configured retry component.

12. The method of claim 11, wherein the modeling notation is associated with a business process model and notation system.

13. The method of claim 11, wherein the received indication includes a selection of a messaging component associated with at least one of: (i) Java message service, (ii) active MQ, and (iii) a custom implementation.

14. The method of claim 13, wherein the received indication includes a selection of at least one of: (i) a quality of service, (ii) a retry period, and (iii) an exponential back off option.

15. A non-transitory, computer-readable medium storing instructions, that, when executed by a processor, cause the processor to perform a method associated with an integration computing environment for an enterprise, the method comprising:
receiving, at an integration modeling design platform from an integration developer via a modeling notation, an indication, associated with a retry icon placed on a task icon via a drag-and-drop operation, that a retry component should be associated with an integration task;
verifying that the drag-and-drop operation is valid for an integration adapter or an integration component associated with the task icon;
configuring, by the integration modeling design platform, the retry component for the integration task in connection with the integration adapter or the integration component; and
automatically constructing, by an integration generation framework, an appropriate runtime retry representation based on the configured retry component.

16. The medium of claim 15, wherein the received indication is associated with selection of a retry checkbox selection.

17. The medium of claim 15, wherein the integration modeling design platform further supports at least one of: (i) a log step component, and (ii) an intercept step component.

18. The medium of claim 15, wherein the integration generation framework automatically creates a domain-specific language software component based on the configured retry component.

* * * * *